(12) United States Patent
Jin

(10) Patent No.: US 8,311,229 B2
(45) Date of Patent: Nov. 13, 2012

(54) REDUCTION OF CLICKING SOUNDS IN AUDIO DATA STREAM

(75) Inventor: Gary Jin, Kanata (CA)

(73) Assignee: Microsemi Semiconductor Corp., Kanata, ON (CA)

( * ) Notice: Subject to any disclaimer, the term of this patent is extended or adjusted under 35 U.S.C. 154(b) by 204 days.

(21) Appl. No.: 12/858,045

(22) Filed: Aug. 17, 2010

(65) Prior Publication Data
US 2011/0051945 A1    Mar. 3, 2011

(30) Foreign Application Priority Data
Aug. 25, 2009 (GB) .................................. 0914802.4

(51) Int. Cl.
H04R 29/00 (2006.01)
H03B 29/00 (2006.01)
H04B 15/00 (2006.01)
H03G 3/20 (2006.01)

(52) U.S. Cl. .......... 381/56; 381/59; 381/71.1; 381/94.1; 381/57

(58) Field of Classification Search .............. 381/56–59, 381/94.1, 71.1–71.9
See application file for complete search history.

(56) References Cited

U.S. PATENT DOCUMENTS

| 4,076,969 A | * | 2/1978 | Sacks ........................... 369/174 |
| 4,501,014 A | | 2/1985 | Bliithgen |
| 5,586,192 A | | 12/1996 | De Bijl |
| 6,320,918 B1 | | 11/2001 | Walker |

FOREIGN PATENT DOCUMENTS

| EP | 0136482 A2 | 4/1985 |
| EP | 0973269 A2 | 1/2000 |

* cited by examiner

*Primary Examiner* — Devona Faulk
(74) *Attorney, Agent, or Firm* — Marks & Clerk; Richard J. Mitchell

(57) ABSTRACT

Disclosed is a method of reducing clicking sounds in an audio data stream. The samples of the audio data are delayed by a predetermined amount in a sliding window containing a predetermined number of samples. The presence of a clicking sound in the delayed data within said sliding window is detected and the corresponding audio data replaced by substitute data derived from the audio data stream.

13 Claims, 2 Drawing Sheets

REDUCTION OF CLICKING SOUNDS IN AUDIO DATA STREAM

FIELD OF INVENTION

The invention relates to field of audio data processing, and in particular to a method and apparatus for reducing clicking sounds in audio data streams.

BACKGROUND OF THE INVENTION

Popping and clicking sounds, hereafter referred to as clicking sounds or clicks, are a common annoyance in audio recordings. They manifest themselves as short duration spikes in the audio signal and are caused by electric instability and sometimes by mechanical movement of the recording device, for example a video camera.

The clicking sound is normally of very short duration (typically less than 50 ms.) but with high magnitude, so it is very audible and annoying.

SUMMARY OF THE INVENTION

An object of the invention is to eliminate or at least reduce clicking sounds in audio recordings. Embodiments of the invention are particularly useful for removing such sounds in recordings made by a video camera.

According to a first aspect of the invention there is provided a method of reducing clicking sounds in an audio data stream, comprising delaying samples of the audio data by a predetermined amount in a sliding window containing a predetermined number of samples; detecting the presence of a clicking sound in the delayed data within said sliding window by comparing the maximum value of a current set of samples within the sliding window with a filtered value derived from the samples subject to a scaling factor; replacing the audio data in the delayed data corresponding to the clicking sounds by substitute data; wherein when said maximum value is smaller than the filtered value, subject to said scaling factor, a negative click indication is produced and a stored peak value is reduced by a factor $\beta$ until it reaches zero, and when said maximum value is greater than both the filtered value and the stored peak value, subject to suitable scaling factors, a positive click indication is produced and the stored peak value is set at the greater of the current maximum value and the current stored peak value; and wherein a counter increments in response to a positive click indication and decrements in response to a negative click indication, and an edge detector responsive to rising and falling edges gives a click start indication in response to an increment and a click end indication in response to a decrement of the counter.

Embodiments of the invention remove clicking sounds during the recording process. The novel method takes advantage of the characteristics of the clicking sound that it has a sharply increased magnitude and short duration. The sharp increase in magnitude makes the noise very audible and annoying and the short duration makes the audio insertion a relative easy job after the clicking sound is detected. The novel mechanism is simple to implement and has a very small MIPS requirement.

The invention is applicable to all forms of audio, including music and speech. Embodiments of the invention can be implemented in a relatively simple manner at low cost without affecting audio quality. The invention is applicable to other forms of voice and speech processing devices.

According to another aspect of the invention there is provided an apparatus for reducing clicks in an audio data stream, comprising a delay unit for storing a delayed sequence of samples in a sliding window; a click detector for detecting clicks in said stored sequence of samples by comparing the maximum value of a current set of samples within the sliding window with a filtered value derived from the samples subject to a scaling factor; a unit for producing a substitute data to replace samples within said audio data stream for the duration of a click; and a multiplexor for substituting said substitute signal in said delayed audio data stream during the duration of a click, and wherein said click detector further comprises a memory for storing a sequence of samples on a sliding window basis; a filter for filtering said samples to produce the filtered value; a comparator for comparing the current maximum value of said stored sequence of samples with said filtered value subject to a scaling factor so as to produce a negative click indication when the current maximum stored value is less than the filtered value subject to a scaling factor and a positive click indication when the current maximum stored value is greater than the filtered value subject to a scaling factor and a stored peak value subject to a scaling factor; a counter that increments in response to a positive click indication and decrements in response to a negative click indication, and an edge detector responsive to rising and falling edges that gives a click start indication in response to an increment edge and a click end indication in response to a decrement of the counter.

BRIEF DESCRIPTION OF THE DRAWINGS

The invention will now be described in more detail, by way of example only, with reference to the accompanying drawings, in which.

DETAILED DESCRIPTION OF THE INVENTION

Figure 1:
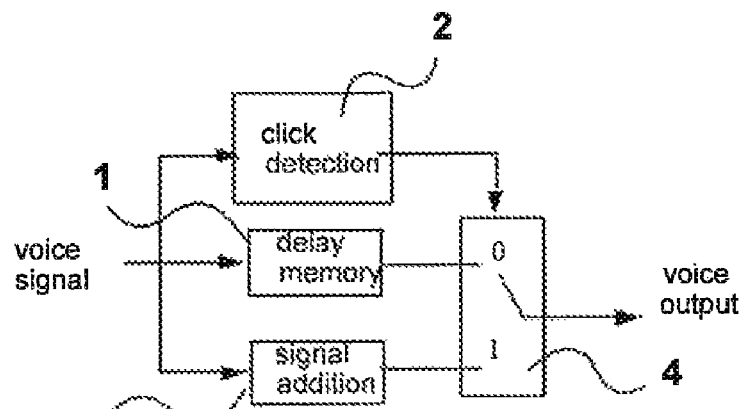
FIG. 1 is a block diagram of a click reduction mechanism in accordance with one embodiment of the invention.

The click reduction circuit shown in FIG. 1 comprises a delay memory 1 for storing a sequence of samples (typically 50 ms), a click detection circuit 2, a signal addition circuit 3, and a multiplexor 4. An audio input signal is input into the delay memory 1, which operates on a sliding window basis. In the absence of clicks the audio data is output unchanged by the multiplexer 4.

When the click detector 2 detects a click in the signal, the data is replaced by data produced in the signal addition circuit 3. Thus, during normal operation, the voice or audio signal will be passed without any modification. The signal has to be delayed to allow for the time required to detect the presence of a click. The outputted audio is delayed by an amount that matches the detection delay.

Figure 2:
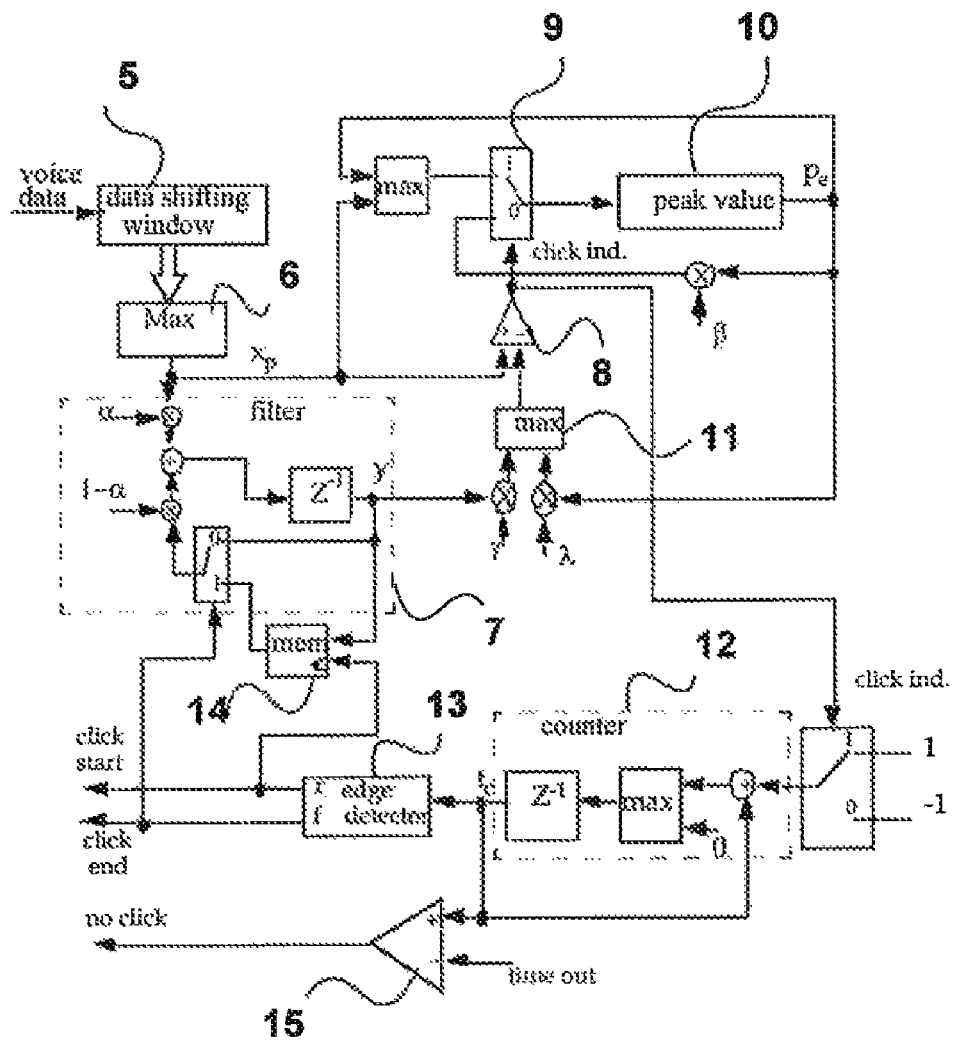
FIG. 2 is a block diagram of a click detection circuit.

The click detection circuit is shown in FIG. 2. The incoming audio samples are passed through a data shifting window 5, which outputs one sample as a new sample is accepted at the input. The entire click detection process is run for each audio data sample.

For each sample period, the maximum value (in magnitude) in the data shifting window is calculated as xp in Max unit 6. The value xp passes through a first order filter 7 ($y(n) = (1-\alpha)y(n-1) + \alpha xp$), which produces an output y, where y is the average peak value in the data shifting window.

The value xp is compared with the output of the filter y, after a scaling factor $\gamma$ has been applied and maximum taken in unit 11, in comparator 8. If the current maximum xp is smaller than the average (filtered) value y with a scaling factor γ, there is a negative (or no) click indication and the click indication (click ind.) is "0". Under such circumstances, the output of the multiplexer 9 is switched to the zero input and the peak value pe stored in memory 10 is reduced by a scaling factor β for every input sample until it reaches 0.

When the current maximum xp is greater than both the average peak y with a scaling γ and the peak value pe with a scaling factor λ, the click indication is positive and the output of the multiplexor 9 is set to the 1 input. In this case, the peak value pe takes the maximum value between current maximum xp and the stored peak value.

A counter 12 is also controlled by click indication bit (0 for no click, 1 for a click detection). When the click indication is 1, the counter 12 increments and otherwise, it decrements until it reaches zero.

An edge detector 13 follows the counter 12, which detects the counter changing from 0 to 1 or from 1 to 0. When the edge detector detects a rising edge i.e., counter changes from 0 to 1, it gives a "click start" indication. At that moment, the average peak value y is placed into a memory 14. When the edge detector 13 detects a falling edge, i.e., counter changes from 1 to 0, it gives a "click end" indication. At that moment, the memory value at click start time is input to the filter 7 instead of previous filter output.

Since clicking sounds are normally very short, if the count in the counter 12 is larger than a given time out value, time-out circuit 15 indicates no click (the signal level increase may caused by high voice input level) and this output overrides the output of the edge detector 13. The counter 12 and peak value Pe are reset to zero and each functional block resumes its normal working status.

The actual parameters are a matter of design choice as will be appreciated by one skilled in the art. However, a sample parameter selection: is as follows:

window size in the data shift window: 10 ms.
α=0.85 per ms.
γ=2.
b=0.85 per ms.
λ=0.3.
time out=60 ms.

When a click is detected, the data associated with the click (for a maximum of 50 ms.) is removed and replaced by substitute data. A suitable data insertion method is described in ITU G.711, the contents of which are herein incorporated by reference.

Figure 3:
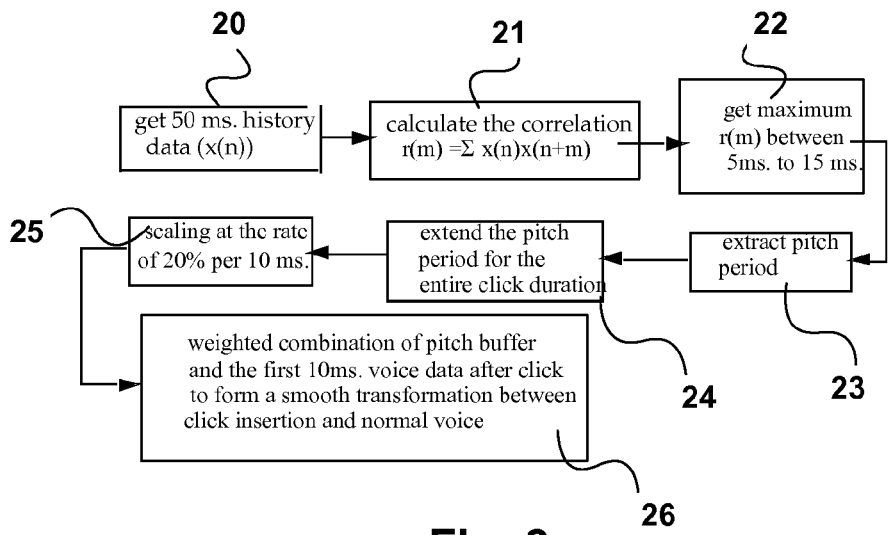
FIG. 3 is a block diagram of a data compensation circuit.

In accordance with an embodiment of the invention, the insertion process is effected as shown in FIG. 3. The process is carried out in the following steps. First at step 20, 50 ms. of history of normal data click is saved. When a click is detected by unit 2, at step 21, 50 ms. of history data just before click is retrieved from memory and used to calculate the auto-correlation $r(m)=\Sigma x(n) \times (n+m)$.

Next at step 22, the maximum of the correlation r(m) in a time window between 5 ms. to 15 ms is obtained. This defines the pitch period.

At step 23, the pitch information is extracted starting from the end of the 50 ms. data memory. This pitch signal is then extended at step 24 for the entire pitch duration. The result is subject to a linear scaling at the rate of 20% per 10 ms at step 25. The linear scaling is illustrated in FIG. 4.

Figure 4:
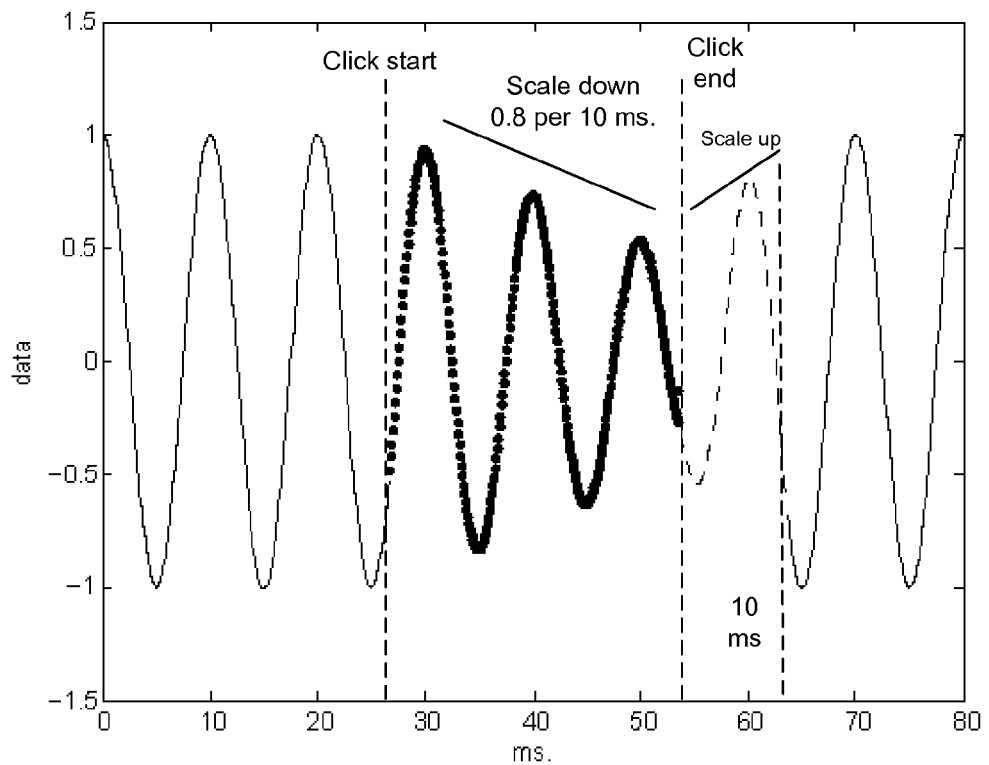
FIG. 4 illustrates an audio data signal with a substituted pitch signal.

To ensure a smooth transformation after signal insertion, the signal is scale up from the value at the end of click duration to a full value in the first 10 ms. after the click as also illustrated in FIG. 4.

Finally, at step 26, a linear combination of graduate weighting down of pitch signal and weighting up of the voice data is carried out in accordance with the equation:

$$y(n)=h(n) \cdot p(n)+(1-h(n)) \cdot d(n)$$

where $h(n)=(N-n)/N$ and N is the number of data in 10 ms. Window, p(n) is the extended pitch signal and d(n) is voice data after pop and click noise.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The term circuit is used herein to encompass functional blocks that may in practice be implemented in software.

The invention claimed is:

1. A method of reducing clicking sounds in an audio data stream, comprising:
   delaying samples of the audio data by a predetermined amount in a sliding window containing a predetermined number of samples;
   detecting the presence of a clicking sound in the delayed data within said sliding window by comparing the maximum value of a current set of samples within the sliding window with a filtered value derived from the samples subject to a scaling factor;
   replacing the audio data in the delayed data corresponding to the clicking sounds by substitute data;
   wherein when said maximum value is smaller than the filtered value, subject to said scaling factor, a negative click indication is produced and a stored peak value is reduced by a factor beta until it reaches zero, and when said maximum value is greater than both the filtered value and the stored peak value, subject to suitable scaling factors, a positive click indication is produced and the stored peak value is set at the greater of the current maximum value and the current stored peak value; and
   wherein a counter increments in response to a positive click indication and decrements in response to a negative click indication, and an edge detector responsive to rising and falling edges gives a click start indication in response to an increment and a click end indication in response to a decrement of the counter.

2. A method as claimed in claim 1, wherein in response to a click end indication, the value of the sample at the click start is input to a filter for producing said filtered value.

3. A method as claimed in claim 2, wherein no click indication is produced if the counter reaches a count greater than a predetermined value.

4. A method as claimed in claim 1, wherein in response to a click indication the maximum of the correlation between saved normal data prior to the click indication and the data delayed by a fixed number of samples is determined within a time window within the click period, pitch period is extracted from the data within said time window, and the corresponding pitch data is used to prepare the substitute data.

5. A method as claimed in claim 4, wherein the data corresponding to the extended pitch period is scaled and weighted with data after the click to form a smooth transition between the inserted data and the normal audio data.

6. An apparatus for reducing clicks in an audio data stream, comprising:
- a delay unit for storing a delayed sequence of samples in a sliding window;
- a click detector for detecting clicks in said stored sequence of samples by comparing the maximum value of a current set of samples within the sliding window with a filtered value derived from the samples subject to a first scaling factor;
- a unit for producing a substitute data to replace samples within said audio data stream for the duration of a click; and
- a first multiplexor for substituting said produced substitute data in said delayed audio data stream during the duration of a click, and wherein said click detector further comprises:
- a memory for storing a sequence of samples on a sliding window basis;
- a filter for filtering said samples to produce the filtered value;
- a comparator for comparing the current maximum value of said stored sequence of samples with said filtered value subject to said first scaling factor so as to produce a negative click indication when the current maximum value of said stored sequence of samples is less than the filtered value subject to said first scaling factor and a positive click indication when the current maximum value of said stored sequence of sample is greater than the filtered value subject to said first scaling factor and a stored peak value subject to a second scaling factor;
- a counter that increments in response to a positive click indication and decrements in response to a negative click indication, and
- an edge detector responsive to rising and falling edges that gives a click start indication in response to an increment edge and a click end indication in response to a decrement of the counter.

7. An apparatus as claimed in claim 6, further comprising a second multiplexor, said second multiplexer comprised within said click detector and configured to reduce said peak value by a third scaling factor until it reaches zero in the presence of a negative click indication.

8. An apparatus as claimed in claim 7, wherein the second multiplexer is configured such that in the presence of a positive click indication, the stored peak value is set at the greater of the current maximum stored value and the current stored peak value.

9. An apparatus as claimed in claim 6, further comprising a time-out unit for overriding the output of the edge detector to produce a no click indication when the count in the counter exceeds a predetermined value.

10. An apparatus as claimed in claim 6, further comprising a correlator for correlating historical normal data immediately preceding a click with data obtained during the click and deriving said substitute data from said correlation.

11. An apparatus as claimed in claim 10, further comprising a unit to extract the pitch period from the correlated data and a unit for extending the pitch period of the duration of the click, and a unit for weighting stored pitch data with data in a time window following the click.

12. An apparatus as claimed in claim 11, wherein the pitch data is scaled down at a predetermined rate.

13. An apparatus as claimed in claim 12, wherein the substitute data is weighted in accordance with the expression:

$$y(n)=h(n){\cdot}p(n)+(1-h(n)){\cdot}d(n)$$

where $h(n)=(N-n)/N$, wherein N is the number of data samples in the time window, $p(n)$ is the extend pitch data, and $d(n)$ is the audio data of the click event.

* * * * *